(12) United States Patent
Fujisawa et al.

(10) Patent No.: US 12,022,626 B2
(45) Date of Patent: Jun. 25, 2024

(54) VENTILATION MECHANISM FOR ELECTRONIC DEVICE HOUSING

(71) Applicant: Mitsubishi Electric Corporation, Tokyo (JP)

(72) Inventors: Kazuya Fujisawa, Tokyo (JP); Kohei Ushio, Tokyo (JP); Kazuki Takabatake, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 497 days.

(21) Appl. No.: 17/275,944

(22) PCT Filed: Sep. 21, 2018

(86) PCT No.: PCT/JP2018/034967
§ 371 (c)(1),
(2) Date: Mar. 12, 2021

(87) PCT Pub. No.: WO2020/059104
PCT Pub. Date: Mar. 26, 2020

(65) Prior Publication Data
US 2022/0061173 A1    Feb. 24, 2022

(51) Int. Cl.
*H05K 5/00*   (2006.01)
*H05K 5/02*   (2006.01)
*H05K 5/06*   (2006.01)

(52) U.S. Cl.
CPC ............. *H05K 5/0213* (2013.01); *H05K 5/06* (2013.01); *H05K 5/068* (2013.01); *H05K 5/069* (2013.01)

(58) Field of Classification Search
CPC ........ H05K 5/0213; H05K 5/06; H05K 5/068; H05K 5/069
USPC ......................................................... 361/690
See application file for complete search history.

(56) References Cited

U.S. PATENT DOCUMENTS

| 7,936,566 B2 * | 5/2011 | Shigyo | ................... H05K 5/068 361/752 |
| 2006/0054019 A1 * | 3/2006 | Waida | ................... H05K 5/0213 96/4 |

(Continued)

FOREIGN PATENT DOCUMENTS

| JP | 01-167082 U | 11/1989 |
| JP | 2014-175907 A | 9/2014 |

(Continued)

OTHER PUBLICATIONS

Communication dated Sep. 10, 2021 by the European Patent Office in application No. 18934220.7.

(Continued)

*Primary Examiner* — Zhengfu J Feng
(74) *Attorney, Agent, or Firm* — Sughrue Mion, PLLC; Richard C. Turner

(57) ABSTRACT

In a ventilation mechanism of an electronic control device, a ventilation path is formed by a through hole and a window formed in a side surface of a projection projecting outward of a case, and entry of water into the ventilation path is prevented by a wall. A water-repellent filter is attached to an inner wall of the case, with a gap between the water-repellent filter and a bottom surface of the projection. The projection and the wall are integrated with the case. This achieves reduction in the number of components of the ventilation mechanism and improvement in machinability while ensuring a waterproof function.

17 Claims, 5 Drawing Sheets

(56) References Cited

U.S. PATENT DOCUMENTS

| | | | | |
|---|---|---|---|---|
| 2008/0196918 A1* | 8/2008 | Zadach | ............... | H05K 5/068 |
| | | | | 174/50.5 |
| 2009/0266815 A1* | 10/2009 | Lauk | ............... | F21V 31/03 |
| | | | | 29/428 |
| 2014/0041520 A1* | 2/2014 | Daimon | ............... | H05K 5/0213 |
| | | | | 96/4 |
| 2014/0254840 A1 | 9/2014 | Norris | | |
| 2015/0208525 A1* | 7/2015 | Negishi | ............... | B60R 16/0239 |
| | | | | 361/752 |

FOREIGN PATENT DOCUMENTS

| | | |
|---|---|---|
| JP | 5714402 B2 | 5/2015 |
| WO | 2014/050591 A1 | 4/2014 |
| WO | 2014/073096 A1 | 5/2014 |

OTHER PUBLICATIONS

Office Action dated Apr. 2, 2022 from the China National Intellectual Property Administration in Chinese Application No. 201880097517.3.

International Search Report for PCT/JP2018/034967 dated Dec. 4, 2018 [PCT/ISA/210].

Written Opinion for PCT/JP2018/034967 dated Dec. 4, 2018 [PCT/ISA/237].

Office Action dated Oct. 13, 2021 in Chinese Application No. 201880097517.3.

Communication dated Mar. 11, 2022, issued by the Intellectual Property Office of India in application No. 202127005937.

\* cited by examiner

VENTILATION MECHANISM FOR ELECTRONIC DEVICE HOUSING

CROSS REFERENCE TO RELATED APPLICATIONS

This application is a National Stage of International Application No. PCT/JP2018/034967 filed Sep. 21, 2018.

TECHNICAL FIELD

The present disclosure relates to a ventilation mechanism of an electronic device housing.

BACKGROUND ART

Housings of electronic devices such as an electronic control device including therein a heat-generating component need to moderate pressure fluctuations caused by changes in the temperatures inside the devices, and include ventilation mechanisms which allow ventilation between the inside and the outside of the devices while ensuring a waterproof function. Regarding a conventional ventilation mechanism of an electronic control device, a ventilation unit which is a component separate from a case of the electronic control device is inserted in an opening provided in the case.

For example, a ventilation unit disclosed in Patent Document 1 is composed of: a ventilation member attached in an opening of a case; a seal member such as an O ring, for sealing a gap between the case and the ventilation member; and an annular partition wall member into which the ventilation member is fitted. Further, the above-described ventilation member includes: a waterproof ventilation film for covering the opening of the case; a support supporting the waterproof ventilation film and to be fixed to the case; and a cover component covering the waterproof ventilation film.

CITATION LIST

Patent Document

Patent Document 1: Japanese Patent No. 5714402

SUMMARY OF THE INVENTION

Problems to be Solved by the Invention

As indicated in Patent Document 1, the conventional ventilation unit includes the seal member, the partition wall member, and the like in addition to the ventilation member composed of a plurality of components. Accordingly, the ventilation unit has a large number of components and is structurally complex. Thus, an electronic control device in which the conventional ventilation unit is used has a problem that the number of components is large and machinability is poor.

The present disclosure has been made to solve the above problems, and an object of the present disclosure is to achieve reduction in the number of components of a ventilation mechanism of an electronic device housing and improvement in machinability.

Solution to the Problems

A ventilation mechanism of an electronic device housing according to the present disclosure is a ventilation mechanism for a housing accommodating an electronic device, the ventilation mechanism including: a projection integrated with the housing and projecting outward of the housing; a wall integrated with the housing and disposed on an outer side of the housing so as to enclose the projection; a window formed in a part of a side surface of the projection and facing an inner circumferential surface of the wall; a through hole forming, together with the window, a ventilation path which allows communication between an outside and an inside of the housing; and a water-repellent filter attached to a region, on an inner side of the housing, that includes the projection and the through hole.

Effect of the Invention

In the ventilation mechanism of the electronic device housing according to the present disclosure, the ventilation path is formed by the through hole and the window formed in the side surface of the projection integrated with the housing, and entry of water into the ventilation path is prevented by the wall integrated with the housing.

Accordingly, the only constituent component of the ventilation mechanism other than the housing is one component, i.e., the water-repellent filter. This achieves reduction in the number of components of the ventilation mechanism and improvement in machinability while ensuring a waterproof function.

Objects, features, viewpoints, and effects of the present disclosure other than the above-described ones will be more clarified from the following detailed description with reference to the drawings.

DESCRIPTION OF EMBODIMENTS

Embodiment 1

Figure 1:
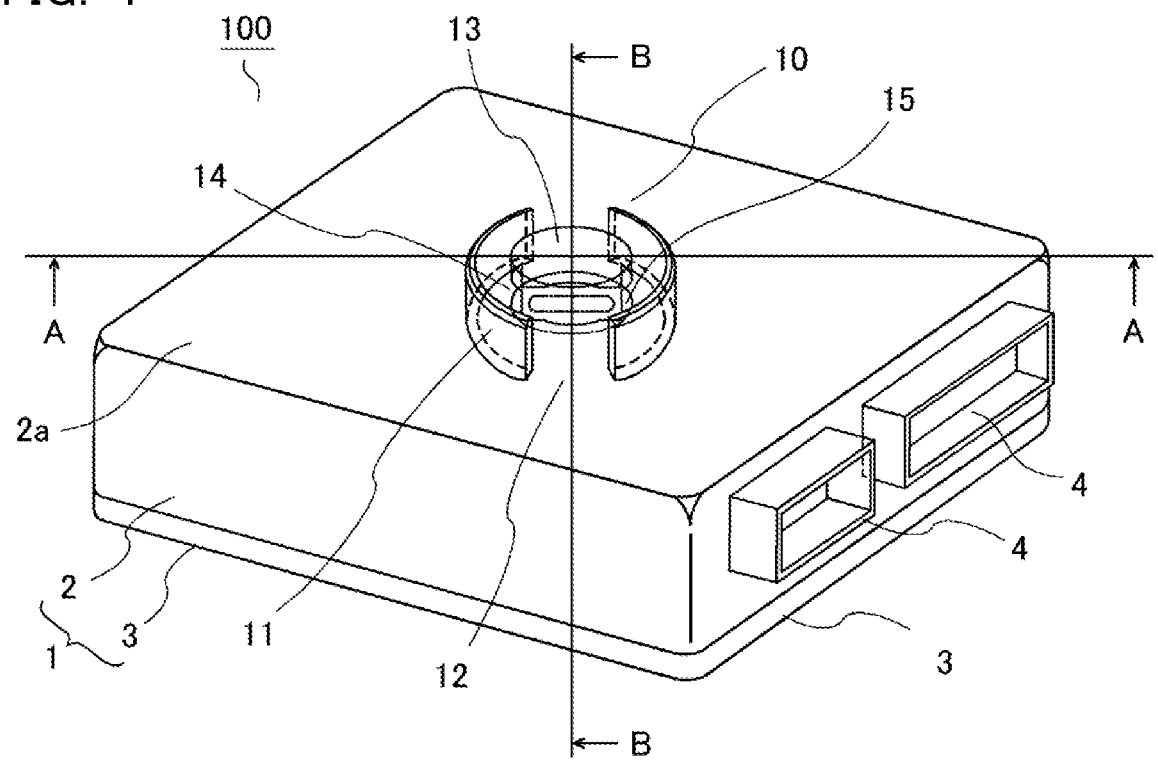
FIG. 1 is a perspective view of an electronic control device having a ventilation mechanism according to embodiment 1.
Figure 2:
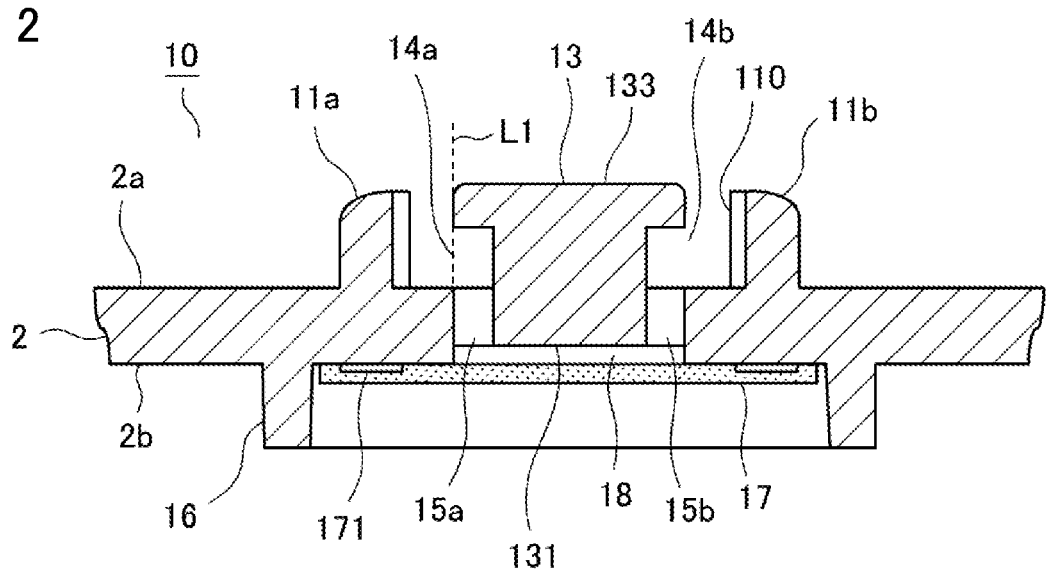
FIG. 2 is a cross-sectional view of the ventilation mechanism of the electronic control device according to embodiment 1.
Figure 3:
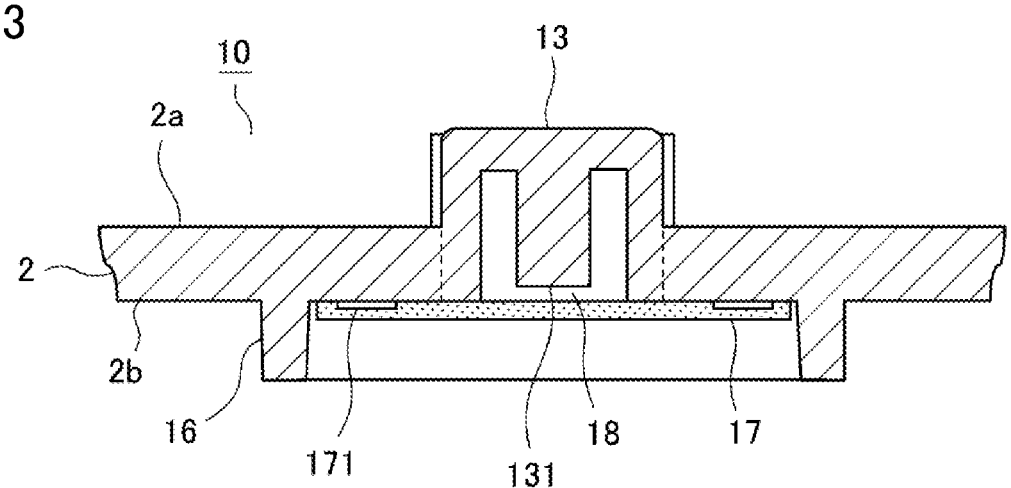
FIG. 3 is a cross-sectional view of the ventilation mechanism of the electronic control device according to embodiment 1.
Figure 4:
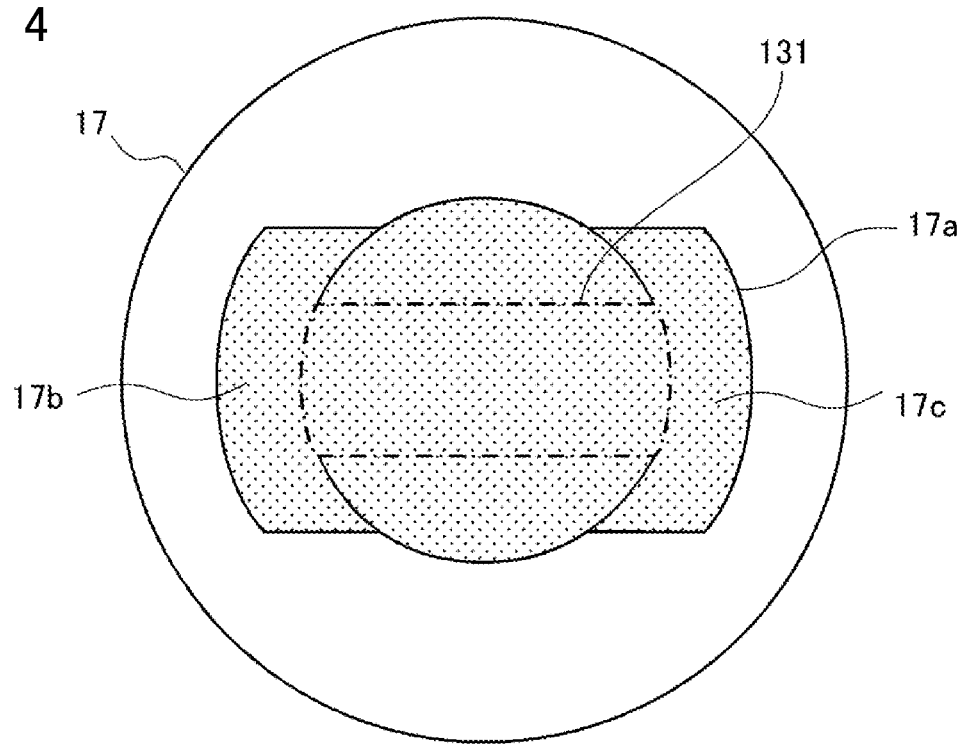
FIG. 4 is a plan view indicating the ventilation area of a water-repellent filter of the ventilation mechanism according to embodiment 1.

Hereinafter, a ventilation mechanism of an electronic device housing according to embodiment 1 will be described with reference to the drawings, with a ventilation mechanism for a housing of an electronic control device being used as an example. FIG. 1 is a perspective view of an electronic control device having a ventilation mechanism according to embodiment 1. FIG. 2 and FIG. 3 show the ventilation mechanism of the electronic control device according to embodiment 1. FIG. 2 is a cross-sectional view taken along a line indicated by A-A in FIG. 1, and FIG. 3 is a cross-sectional view taken along a line indicated by B-B in FIG. 1. FIG. 4 is a plan view indicating the ventilation area of a water-repellent filter. In the drawings, identical and corresponding portions are denoted by the same reference characters.

As shown in FIG. 1, a housing 1 of an electronic control device 100 includes a case 2 and a base 3. In the housing 1, a control board (not shown) mounted with an electronic component is accommodated. An upper surface 2a of the case 2 is provided with a ventilation mechanism 10 which allows ventilation between the inside and the outside of the housing 1. On a side surface of the case 2, connectors 4 for connecting the control board and external devices to each other are disposed. The inside of the housing 1 experiences change in the temperature due to a heat-generating component or cooling means for the heat-generating component. A pressure fluctuation caused by the change in the temperature is moderated by the ventilation mechanism 10.

A structure of the ventilation mechanism 10 according to embodiment 1 will be described with reference to FIG. 1 to FIG. 4. In the following description, a dimension in a direction perpendicular to the upper surface 2a of the case 2 on which the ventilation mechanism 10 is disposed is referred to as a height dimension, and a dimension in a direction parallel to the upper surface 2a of the case 2 is referred to as a width dimension. The ventilation mechanism 10 includes walls 11a and 11b (collectively referred to as walls 11), a projection 13, windows 14a and 14b (collectively referred to as windows 14), through holes 15a and 15b (collectively referred to as through holes 15), and a water-repellent filter 17.

The projection 13 projects outward of the case 2, and the walls 11 are disposed on an outer side of the case 2 so as to enclose the projection 13. The projection 13 and the walls 11 are integrated with the case 2. Each window 14 formed in a part of a side surface of the projection 13 faces an inner circumferential surface 110 of the corresponding wall 11. Below the window 14, the corresponding through hole 15 penetrating the case 2 is formed. The through hole 15 forms, together with the window 14, a ventilation path which allows communication between an outside and an inside of the housing 1.

As shown in FIG. 2, in a cross section of the ventilation mechanism 10, an imaginary straight line L1 obtained by extending a radially outermost portion of a through hole 15 coincides with the radially outermost portion of the projection 13. In embodiment 1, the height dimension of the wall 11 is slightly smaller than the height dimension of the projection 13 and larger than the height dimension of the window 14. The width dimension of the window 14 is smaller than the width dimension of the inner circumferential surface 110 of the wall 11 facing the window 14. The opening area of the window 14 is smaller than the area of the inner circumferential surface 110 of the wall 11 facing the window 14. A top portion 133 of the projection 13 is present above the window 14 and serves as eaves. With such a configuration, water is less likely to be directly splattered on the window 14, whereby entry of water into the ventilation path can be prevented.

In embodiment 1, two circular arc-shaped walls 11a and 11b are disposed so as to be apart from each other, and the walls 11a and 11b have cuts 12 therebetween. Each cut 12 serves as a path through which water flows out when water is splattered on the ventilation mechanism 10. Thus, no windows 14 are provided in side surfaces, of the projection 13, that face the cuts 12 of the walls 11.

As shown in FIG. 2 and FIG. 3, an annular enclosing portion 16 integrated with the case 2 is disposed on an inner wall 2b on an inner side of the case 2, and the water-repellent filter 17 is disposed within the enclosing portion 16. The enclosing portion 16 has functions as a positioning member and a guard fence for the water-repellent filter 17. The water-repellent filter 17 is attached to a region, on the inner side of the case 2, that includes the projection 13 and the through holes 15. The water-repellent filter 17 repels water drops, and thus, even if water enters either through hole 15, entry of water into the housing 1 can be prevented.

The water-repellent filter 17 is adhered, at an adhesion portion 171 near the outer rim thereof, to the inner wall 2b of the case 2, and a gap 18 is provided between a bottom surface 131 of the projection 13 and the water-repellent filter 17. Accordingly, even when the water-repellent filter 17 vibrates, the water-repellent filter 17 does not come into contact with the bottom surface 131 of the projection 13, whereby damage to the water-repellent filter 17 can be prevented.

The ventilation area of the water-repellent filter 17 will be described with reference to FIG. 4. In FIG. 4, a dotted region 17a indicates the ventilation area of the water-repellent filter 17, and a dotted line indicates a region facing the bottom surface 131 of the projection 13. The water-repellent filter 17 has a substantially circular shape, and the region 17a indicating the ventilation area of the water-repellent filter 17 includes: the region facing the bottom surface 131 of the projection 13; and regions 17b and 17c facing the through holes 15a and 15b. In this manner, if the gap 18 is provided between the bottom surface 131 of the projection 13 and the water-repellent filter 17, a ventilation area that occupies a major part of the area of the water-repellent filter 17 is ensured.

Figure 5:
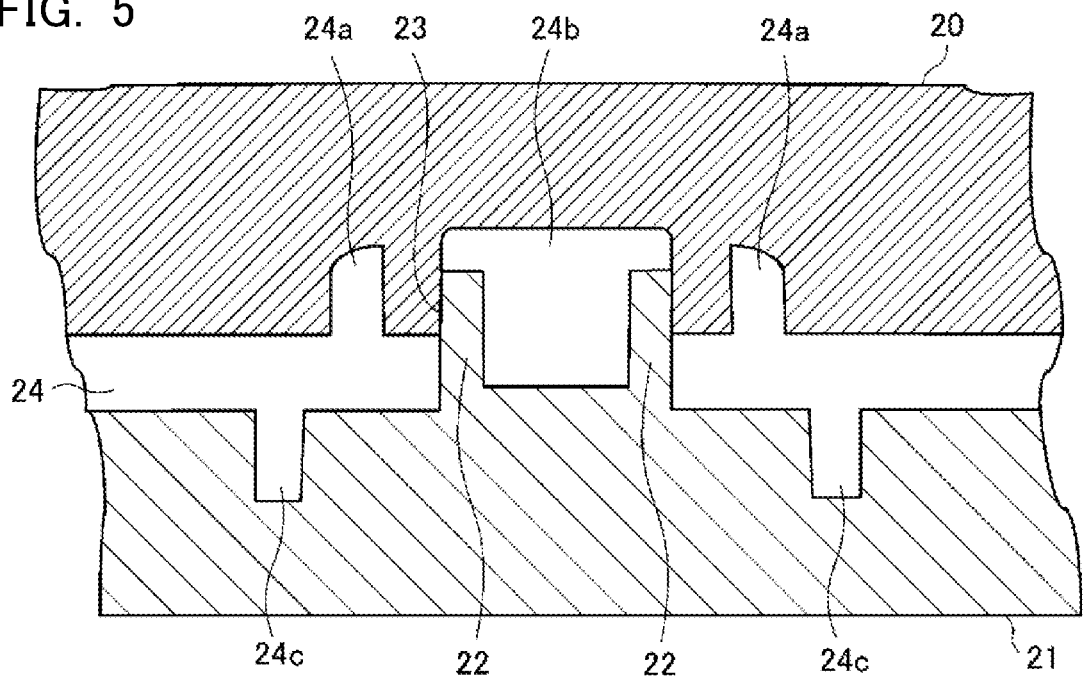
FIG. 5 is a partial cross-sectional view of molds for molding a case of the electronic control device according to embodiment 1.
Figure 6:
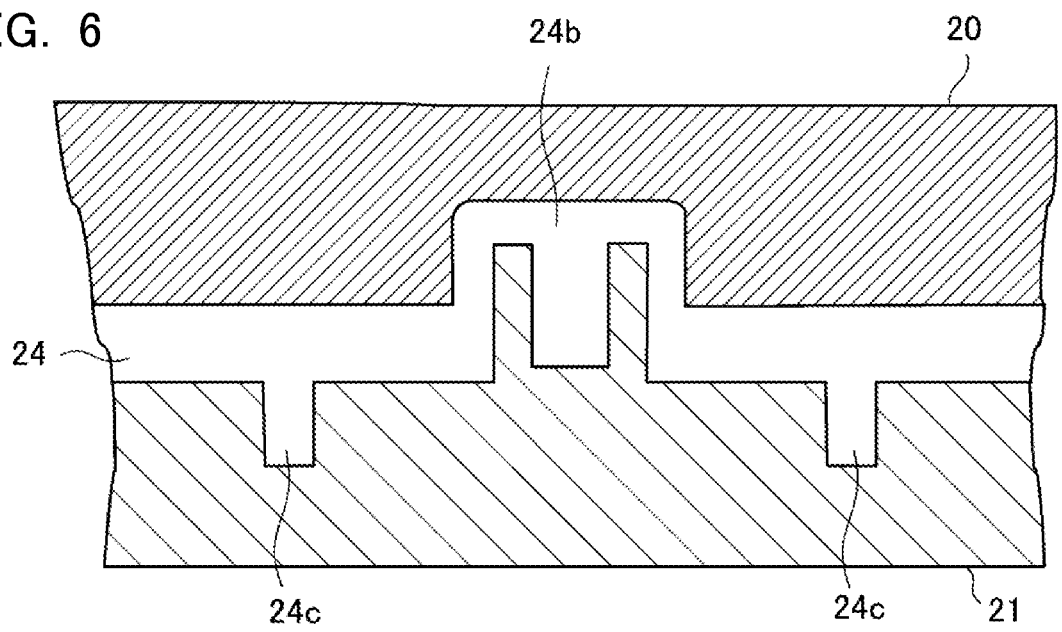
FIG. 6 is a partial cross-sectional view of the molds for molding the case of the electronic control device according to embodiment 1.

A producing method for the ventilation mechanism 10 according to embodiment 1, particularly, a method for forming the windows 14 and the through holes 15, will be described with reference to FIG. 5 and FIG. 6. FIG. 5 and FIG. 6 are partial cross-sectional views of molds for molding the case of the electronic control device. FIG. 5 shows a cross section of the molds in molding for the cross section of the ventilation mechanism shown in FIG. 2, and FIG. 6 shows a cross section of the molds in molding for the cross section of the ventilation mechanism shown in FIG. 3. The molds for forming the case 2 include an upper mold 20 and a lower mold 21.

As shown in FIG. 5, the lower mold 21 has through hole forming portions 22 for forming the through holes 15. The outer surfaces of the through hole forming portions 22 and the upper mold 20 are in contact with each other, and contact surfaces 23 are present on the upper mold 20 and the lower mold 21. A cavity 24 is formed on the inside between the upper mold 20 and the lower mold 21. The cavity 24 includes: wall forming portions 24a for forming the walls 11; a projection forming portion 24b for forming the projection 13; and an enclosing portion forming portion 24c for forming the enclosing portion 16.

Resin is caused to flow into the cavity 24 and cured, and then the upper mold 20 and the lower mold 21 are removed. Consequently, the contact surfaces 23 form the windows 14, and each through hole 15 and the corresponding window 14 are in communication with each other. In the cross section of the molds shown in FIG. 5, the radially outermost portion of each through hole forming portion 22, the corresponding contact surface 23, and the radially outermost portion of the projection forming portion 24b are on the same straight line.

With such upper mold 20 and lower mold 21, it is possible to easily form: the projection 13 having the window 14 in a part of the side surface thereof; and the through hole 15 in communication with the window 14. In addition, the wall 11 and the enclosing portion 16 can also be formed at the same time. Thereafter, the water-repellent filter 17 is attached within the enclosing portion 16 formed on the inner wall 2b of the case 2, whereby the ventilation mechanism 10 is completed.

As described above, in embodiment 1, the ventilation path is formed by the through hole 15 and the window 14 formed in the side surface of the projection 13 integrated with the case 2, and entry of water into the ventilation path is prevented by the wall 11 integrated with the case 2. Accordingly, the only constituent component of the ventilation mechanism 10 other than the case 2 is one component, i.e., the water-repellent filter 17. This achieves reduction in the number of components of the ventilation mechanism 10 and improvement in machinability while ensuring a waterproof function.

In addition, the height dimension of the wall 11 facing the window 14 is set to be larger than the height dimension of the window 14, and the width dimension of the window 14 is set to be smaller than the width dimension of the inner circumferential surface 110 of the wall 11. Accordingly, entry of water into the ventilation path can be inhibited, whereby the waterproof function can be ensured. Further, since the gap 18 is provided between the bottom surface 131 of the projection 13 and the water-repellent filter 17, the ventilation area of the water-repellent filter 17 can be ensured, whereby a ventilation function can be ensured.

Embodiment 2

Figure 7:
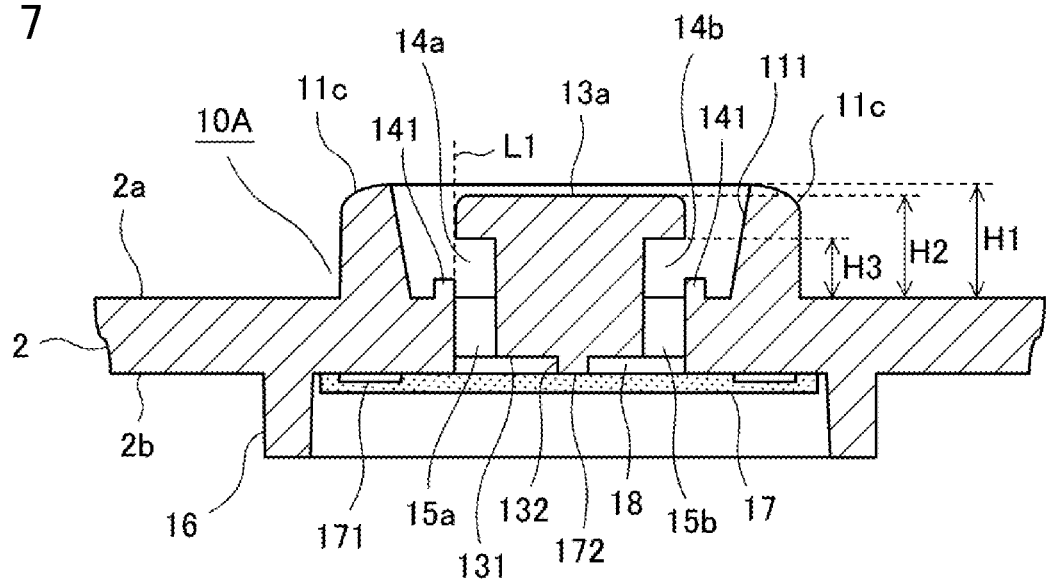
FIG. 7 is a cross-sectional view of a ventilation mechanism of an electronic control device according to embodiment 2.

FIG. 7 is a partial cross-sectional view of a ventilation mechanism of an electronic control device according to embodiment 2. A ventilation mechanism 10A according to embodiment 2 is a modification of the above-described ventilation mechanism 10 according to embodiment 1 and is the same as the ventilation mechanism 10 in terms of the main configuration, the producing method, and the like. Thus, only the differences therebetween will be briefly described here.

In the above-described embodiment 1, the height dimension of the wall 11 is set to be slightly smaller than the height dimension of the projection 13. Meanwhile, in the ventilation mechanism 10A according to embodiment 2, the height dimension H1 of a wall 11c is equal to or larger than the height dimension H2 of a projection 13a (H1≥H2). As in the above-described embodiment 1, the height dimension H1 of the wall 11c is larger than the height dimension H3 of the window 14 (H1>H3). With such a configuration, water can be even better prevented from being directly splattered on the window 14 than in the above-described embodiment 1.

In addition, the wall 11c of the ventilation mechanism 10A has an annular shape, and there are no such cuts 12 (see FIG. 1) of the wall 11 as those in embodiment 1. Accordingly, the inner circumferential surface of the wall 11c is tilted such that water is easily discharged when the water enters the inner side of the wall 11c. That is, the wall 11c has an annular tilted surface 111. In addition, the ventilation mechanism 10A has a bank portion 141 integrated with the case 2 and provided along the rim of the through hole 15. The bank portion 141 is located at a lower side of the window 14 and has a function as a bank to stop water having entered the inner side of the wall 11c. It is noted that embodiment 2 is the same as the above-described embodiment 1 in that, in a cross section of the ventilation mechanism 10A, the imaginary straight line L1 obtained by extending the radially outermost portion of the through hole 15 coincides with the radially outermost portion of the projection 13a.

In addition, the projection 13a has a protruding portion 132 on the bottom surface 131 thereof, and the protruding portion 132 is adhered to the water-repellent filter 17. That is, the water-repellent filter 17 is fixed to the case 2 at the adhesion portion 171 near the outer rim and an adhesion portion 172 near the center of the water-repellent filter 17. Accordingly, vibration of the water-repellent filter 17 is suppressed. It is noted that the area of the adhesion portion 172 is desirably small in order to ensure the ventilation area of the water-repellent filter 17.

According to embodiment 2, improvement in the waterproof function is further achieved in addition to the same advantageous effects as those in the above-described embodiment 1. It is noted that the tilted surface 111 of the wall 11c, the bank portion 141, the protruding portion 132, and the like of the ventilation mechanism 10A according to embodiment 2 can be provided also to the ventilation mechanism 10 according to embodiment 1.

Embodiment 3

Figure 8:
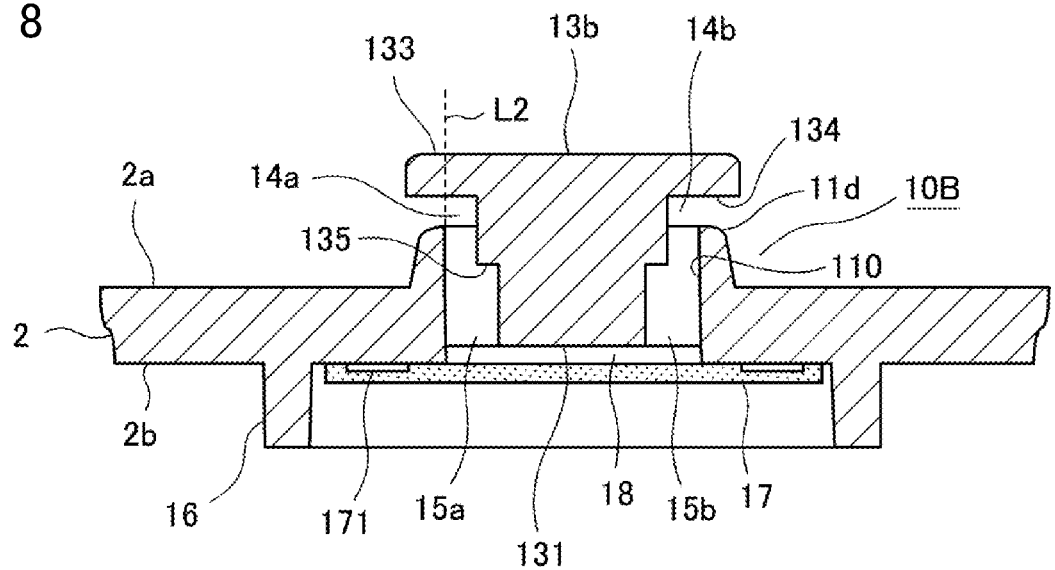
FIG. 8 is a cross-sectional view of a ventilation mechanism of an electronic control device according to embodiment 3.
Figure 9:
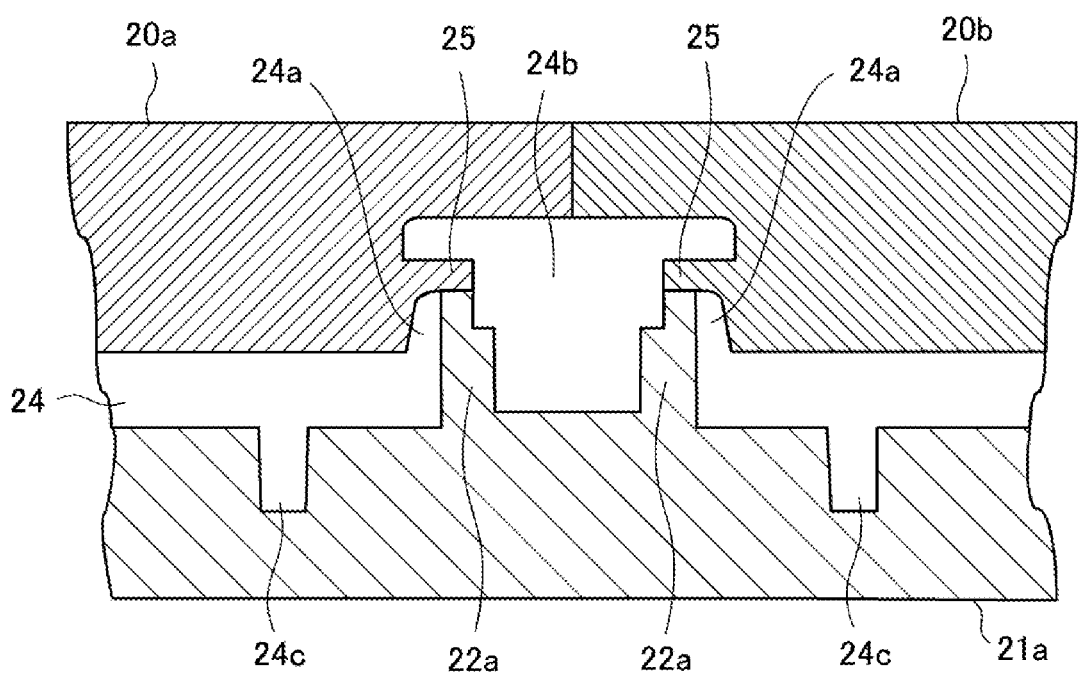
FIG. 9 is a partial cross-sectional view of molds for molding a case of the electronic control device according to embodiment 3.

FIG. 8 is a partial cross-sectional view of a ventilation mechanism of an electronic control device according to embodiment 3. FIG. 9 is a partial cross-sectional view of molds for molding a case of the electronic control device according to embodiment 3. A ventilation mechanism 10B according to embodiment 3 is a modification of the above-described ventilation mechanism 10 according to embodiment 1 and is the same as the ventilation mechanism 10 in terms of the main configuration. Thus, only the differences therebetween will be briefly described here.

In the ventilation mechanism 10B, the height dimension of a projection 13b is larger than the height dimension of an annular wall 11d, and the top portion 133 of the projection 13b extends upward of the wall 11d in the form of eaves. That is, an eaves portion 134 is formed above the ventilation path formed by the window 14 and the through hole 15. In a cross section of the ventilation mechanism 10B, an imaginary straight line L2 obtained by extending the radially outermost portion of the through hole 15 coincides with the inner circumferential surface 110 of the wall 11d.

In addition, the projection 13b has a step 135 near the center of a side surface thereof in which the window 14 is formed. Thus, the ventilation path is not linear. Accordingly, the water entry path including the inner circumferential surface 110 of the wall 11d has a complex shape as a labyrinth does, whereby entry of water into the water-repellent filter 17 can be prevented. In addition, by providing the step 135, it is possible to reduce the opening area of the window 14 while ensuring the ventilation area of the water-repellent filter 17, whereby the waterproof function and the ventilation function can be ensured. It is noted that, in the ventilation mechanism 10B, the same protruding portion 132 as that in the above-described embodiment 2 may be provided to the bottom surface 131 of the projection 13b.

A producing method for the ventilation mechanism 10B according to embodiment 3 will be described with reference to FIG. 9. In FIG. 9, upper molds 20a and 20b have such structures as to be separated in the left-right direction. The upper molds 20a and 20b have window forming portions 25 for forming the windows 14a and 14b, respectively. The lower mold 21a has through hole forming portions 22a for forming the through holes 15a and 15b. A cavity 24 formed by the upper molds 20a and 20b and the lower mold 21a includes: a wall forming portion 24a for forming the wall 11d; a projection forming portion 24b for forming the projection 13b; and the enclosing portion forming portion 24c for forming the enclosing portion 16.

Resin is caused to flow into the cavity 24 and cured, and then the upper molds 20a and 20b are separated to the left and the right. Consequently, it is possible to form the ventilation mechanism 10B in which the windows 14 and the wall 11d are disposed below the eaves portion 134 of the projection 13b. In addition, the through holes 15 can be formed by removing the through hole forming portions 22a of the lower mold 21a in the downward direction in FIG. 9.

According to embodiment 3, downsizing of the ventilation mechanism and improvement in the waterproof function are achieved in addition to the same advantageous effects as those in the above-described embodiment 1. Although two windows 14 and two through holes 15 are provided in the above-described embodiment 1 to embodiment 3, the number of windows 14 and the number of through holes 15 may each be one or may each be three or more. In addition, it is needless to say that the ventilation mechanisms 10, 10A, and 10B according to embodiment 1 to embodiment 3 are not limited to ventilation mechanisms for electronic control devices 100 but are used as ventilation mechanisms for housings of other electronic devices.

Although the disclosure is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations to one or more of the embodiments of the disclosure. It is therefore understood that numerous modifications which have not been exemplified can be devised without departing from the scope of the specification of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS 1 housing
2 case
2a upper surface
2b inner wall
3 base
4 connector
10, 10A, 10B ventilation mechanism
11, 11a, 11b, 11c, 11d wall
12 cut
13, 13a, 13b projection
14, 14a, 14b window
15, 15a, 15b through hole
16 enclosing portion
17 water-repellent filter
17a, 17b, 17c region
18 gap
20, 20a, 20b upper mold
21, 21a lower mold
22, 22a through hole forming portion
23 contact surface
24 cavity
24a wall forming portion
24b projection forming portion
24c enclosing portion forming portion
25 window forming portion
100 electronic control device
110 inner circumferential surface
111 tilted surface
131 bottom surface
132 protruding portion
133 top portion
134 eaves portion
135 step
141 bank portion
171, 172 adhesion portion

The invention claimed is:

1. A ventilation mechanism comprising a housing accommodating an electronic device, the ventilation mechanism comprising:
   a projection integrated with the housing and projecting outward beyond an outermost plane of the housing;
   a wall integrated with the housing and disposed on an outer side of the housing so as to enclose the projection;
   a window formed in a part of a side surface of the projection and facing an inner circumferential surface of the wall;
   a through hole forming, together with the window, a ventilation path which allows communication between an outside and an inside of the housing; and
   a water-repellent filter attached to a region, on an inner side of the housing, that includes the projection and the through hole.

2. The ventilation mechanism according to claim 1, wherein a height dimension of the wall is larger than a height dimension of the window.

3. The ventilation mechanism according to claim 1, wherein a height dimension of the wall is equal to or larger than a height dimension of the projection.

4. The ventilation mechanism according to claim 1, wherein a width dimension of the window is smaller than a width dimension of the inner circumferential surface of the wall facing the window.

5. The ventilation mechanism according to claim 1, wherein an opening area of the window is smaller than an area of the inner circumferential surface of the wall facing the window.

6. The ventilation mechanism according to claim 1, wherein, in a cross section of the ventilation mechanism, an imaginary straight line obtained by extending a radially outermost portion of the through hole coincides with a radially outermost portion of the projection.

7. The ventilation mechanism according to claim 1, wherein the inner circumferential surface of the wall is tilted.

8. The ventilation mechanism according to claim 1, wherein the ventilation mechanism further comprises a bank portion integrated with the housing and provided along a rim of the through hole.

9. The ventilation mechanism according to claim 1, wherein
a height dimension of the projection is larger than a height dimension of the wall, and
a top portion of the projection is extended beyond the wall in a form of eaves.

10. The ventilation mechanism according to claim 9, wherein, in a cross section of the ventilation mechanism, an imaginary straight line, obtained by extending a radially outermost portion of the through hole, coincides with the inner circumferential surface of the wall.

11. The ventilation mechanism according to claim 1, wherein
the ventilation mechanism further comprises an annular enclosing portion integrated with the housing and disposed on the inner side of the housing, and
the water-repellent filter is disposed within the enclosing portion.

12. The ventilation mechanism according to claim 1, wherein a gap is provided between a bottom surface of the projection and the water-repellent filter.

13. The ventilation mechanism according to claim 12, wherein
the projection has a protruding portion on the bottom surface thereof, and
the protruding portion is adhered to the water-repellent filter.

14. The ventilation mechanism according to claim 1, wherein the projection has a step at the side surface thereof in which the window is formed.

15. The ventilation mechanism according to claim 1, wherein the wall includes a plurality of walls disposed so as to be apart from each other.

16. The ventilation mechanism according to claim 1, wherein the wall has an annular shape.

17. The ventilation mechanism according to claim 1, wherein the projection is projected further outward from the housing than the wall.

* * * * *